(12) United States Patent
Tanokuchi et al.

(10) Patent No.: US 11,335,533 B2
(45) Date of Patent: May 17, 2022

(54) CHARGED PARTICLE BEAM DEVICE

(71) Applicant: Hitachi High-Technologies Corporation, Tokyo (JP)

(72) Inventors: Akito Tanokuchi, Tokyo (JP); Seiichiro Kanno, Tokyo (JP); Kei Shibayama, Ibaraki (JP)

(73) Assignee: Hitachi High-Tech Corporation, Tokyo (JP)

( * ) Notice: Subject to any disclaimer, the term of this patent is extended or adjusted under 35 U.S.C. 154(b) by 116 days.

(21) Appl. No.: 16/474,846

(22) PCT Filed: Feb. 24, 2017

(86) PCT No.: PCT/JP2017/007084
§ 371 (c)(1),
(2) Date: Jun. 28, 2019

(87) PCT Pub. No.: WO2018/154705
PCT Pub. Date: Aug. 30, 2018

(65) Prior Publication Data
US 2021/0134555 A1    May 6, 2021

(51) Int. Cl.
*H01J 37/20* (2006.01)
*H01J 37/28* (2006.01)
(52) U.S. Cl.
CPC ............. *H01J 37/20* (2013.01); *H01J 37/28* (2013.01); *H01J 2237/202* (2013.01); *H01J 2237/2007* (2013.01)
(58) Field of Classification Search
CPC .......... H01J 37/00; H01J 37/02; H01J 37/026; H01J 37/20
(Continued)

(56) References Cited

U.S. PATENT DOCUMENTS 6,252,705 B1    6/2001  Lo et al.
9,401,297 B2    7/2016  Ebizuka et al.
(Continued)

FOREIGN PATENT DOCUMENTS

JP    9-275079 A    10/1997
JP    2000-357482 A    12/2000
(Continued)

OTHER PUBLICATIONS

International Search Report (PCT/ISA/210) issued in PCT Application No. PCT/JP2017/007084 dated Jun. 13, 2017 with English translation (eight (8) pages).
(Continued)

*Primary Examiner* — Jason L McCormack
(74) *Attorney, Agent, or Firm* — Crowell & Moring LLP (57) ABSTRACT

The purpose of the present invention is to provide a charged particle beam device which suppresses sample deformation caused by placing a sample on a suctioning surface of an electrostatic chuck mechanism, the sample having a temperature different from the suctioning surface. Proposed is a charged particle beam device which has an electrostatic chuck mechanism, the charged particle beam device being provided with: a stage (200) which moves a sample, which is to be irradiated with a charged particle beam, relative to an irradiation position of the charged particle beam; an insulating body (203) which is disposed on the stage and constitutes a dielectric layer of the electrostatic chuck; a first support member (402) which supports the insulating body on the stage; a ring-shaped electrode (400) which encloses the surroundings of the sample and is installed on the insulating body in a contactless manner, and to which a predetermined voltage is applied; and a second support member (405) which supports the ring-shaped electrode.

10 Claims, 8 Drawing Sheets

405: CORRECTION ELECTRODE SUPPORT PORTION
406: INSULATING BODY
407: ENCLOSED SPACE (58) Field of Classification Search
USPC .......................... 250/453.11, 440.11, 442.11
See application file for complete search history.

(56) References Cited

U.S. PATENT DOCUMENTS

| | | | |
|---|---|---|---|
| 2011/0095185 A1* | 4/2011 | Miya | H01L 22/10 |
| | | | 250/311 |
| 2012/0074316 A1 | 3/2012 | Watanabe et al. | |
| 2014/0223616 A1* | 8/2014 | Huang | G01N 21/94 |
| | | | 850/9 |
| 2015/0097123 A1* | 4/2015 | Ebizuka | H02N 13/00 |
| | | | 250/440.11 |
| 2015/0262857 A1* | 9/2015 | Ebizuka | H01J 37/28 |
| | | | 250/442.11 |
| 2017/0047193 A1 | 2/2017 | Jiang et al. | |

FOREIGN PATENT DOCUMENTS

| | | |
|---|---|---|
| JP | 2002-15977 A | 1/2002 |
| JP | 3155802 U | 12/2009 |
| JP | 2012-64567 A | 3/2012 |
| JP | 2013-101974 A | 5/2013 |
| JP | 2015-176683 A | 10/2015 |

OTHER PUBLICATIONS

Japanese-language Written Opinion (PCT/ISA/237) issued in PCT Application No. PCT/JP2017/007084 dated Jun. 13, 2017 (six (6) pages).

Japanese-language Office Action issued in Japanese Application No. 2020-125667 dated Aug. 31, 2021 (three (3) pages).

\* cited by examiner

[FIG. 1]

100: CD-SEM
101: VACUUM CHAMBER
104: SAMPLE STOCKER
105: MOVING PATH OF OBSERVATION TARGET
200: STAGE
201: HOLDING MECHANISM
202: OBSERVATION TARGET
300: ELECTRON OPTICAL SYSTEM

[FIG. 2]

203: ELECTROSTATIC CHUCK
204: CORRECTION ELECTRODE
205: WAFER
402: CHUCK SUPPORT PORTION

[FIG. 3]

300: ELECTRON OPTICAL SYSTEM
301: ELECTRON GUN
302: EXTRACTION ELECTRODE
303: CONDENSER LENS
305: SCANNING DEFLECTOR
306: DIAPHRAGM
308: E CROSS B DEFLECTOR (WIEN FILTER)
309: OBJECTIVE LENS
314: SECONDARY ELECTRON DETECTOR
316: SHIELD ELECTRODE
318: OPTICAL AXIS
322: PRIMARY ELECTRON BEAM
324: ACCELERATED SECONDARY ELECTRON BEAM
326: RETARDING POWER SUPPLY
327: ANALYSIS UNIT
329: CONTROL UNIT
332: SECONDARY ELECTRON BEAM
348: VOLTAGE VARIABLE DC POWER SUPPLY
1000: DISTANCE FROM OPTICAL SYSTEM

[FIG. 4]

349: OUTSIDE SPACE
350: EQUIPOTENTIAL SURFACE

[FIG. 5]

400: ALUMINUM CORRECTION ELECTRODE
401: SCREW
403: THERMOSTAT DEVICE

405: CORRECTION ELECTRODE SUPPORT PORTION
406: INSULATING BODY
407: ENCLOSED SPACE

[FIG. 8]

408: COLUMNAR CORRECTION ELECTRODE SUPPORT PORTION

[FIG. 9]

409 : CERAMIC FLATNESS CORRECTING MATERIAL

[FIG. 10]

500 : CORRECTION ELECTRODE MADE OF MIXTURE OF ALUMINUM AND METAL SILICON

[FIG. 11]

501: CORRECTION ELECTRODE MADE OF MIXTURE OF ALUMINUM AND METAL SILICON COVERED WITH Ni ELECTROLESS PLATING

CHARGED PARTICLE BEAM DEVICE

TECHNICAL FIELD

The present invention relates to a charged particle beam device, and particularly to a charged particle beam device including an electrostatic chuck mechanism.

BACKGROUND ART

A scanning electron microscope for measuring and inspecting a semiconductor wafer employs an electrostatic chuck mechanism as a support mechanism for supporting the semiconductor wafer to be irradiated with an electron beam. The electrostatic chuck applies a voltage to a metal electrode provided therein, a positive or negative charge is generated on surfaces of an object to be attracted and the electrostatic chuck, and the object to be attracted is fixed by a Coulomb force acting therebetween. PTL 1 discloses an electrostatic chuck mechanism provided with a ring-shaped correction electrode surrounding an outer periphery of a sample, in order to suppress an influence on electron beams of an electric field generated near a peripheral portion of an object to be attracted by applying a voltage to the electrostatic chuck. Although an electric field which can be represented by an equipotential line parallel to the surface of the sample is formed between the electrostatic chuck mechanism and an objective lens directly above the sample, the electric field changes at an end portion of the sample, and becomes a deflection electric field deflecting the beams. By applying an appropriate voltage to the correction electrode, the beam deflection can be suppressed.

PRIOR ART LITERATURE

Patent Literature

PTL 1: JP-A-2015-176683 (corresponding to U.S. Pat. No. 9,401,297)

SUMMARY OF INVENTION

Technical Problem

A sample attraction surface of the electrostatic chuck is formed of, for example, an insulating ceramic as a dielectric layer. Meanwhile, the correction electrode is formed of conductive aluminum or the like. In order to uniformly suppress the deflection effect of the beams regardless of the irradiation position of the beams, it is necessary to align the sample attraction surface of the electrostatic chuck with the correction electrode with high accuracy, and thus, as described in PTL 1, a member forming the dielectric layer and the correction electrode are directly coupled. However, the study of the inventors has been found that when in such a configuration a sample having a temperature different from that of the dielectric layer is mounted on the attraction surface, heat is transferred to the dielectric layer and the correction electrode attached to the member forming the dielectric layer, and there is a possibility that a warp like a bimetal occurs. When the attraction surface supporting the sample is warped, the sample also deforms along the attraction surface. When the sample is warped, the height of the sample may change, and the beam may not be focused. PTL 1 does not discuss the suppression of such warp of the attraction surface at all.

Hereinafter, proposed is a charged particle beam device for suppressing sample deformation caused by mounting the sample having a temperature different from that of the attraction surface of the electrostatic chuck mechanism.

Solution to Problem

According to one embodiment for achieving the object, proposed is a charged particle beam device including an electrostatic chuck mechanism, in which the charged particle beam device is provided with: a stage which moves a sample, which is to be irradiated with a charged particle beam, relative to an irradiation position of the charged particle beam; an insulating body which is disposed on the stage and constitutes a dielectric layer of the electrostatic chuck; a first support member which supports the insulating body on the stage; a ring-shaped electrode which encloses the surroundings of the sample and is installed on the insulating body in a contactless manner, and to which a predetermined voltage is applied; and a second support member which supports the ring-shaped electrode.

Advantageous Effect

According to the above configuration, even when there is a temperature difference between the sample mounted on the electrostatic chuck and the attraction surface of the electrostatic chuck, it is possible to effectively suppress the sample deformation.

DESCRIPTION OF EMBODIMENTS

The embodiments described below relate to an electrostatic chuck mechanism and a semiconductor inspection and measurement device, and particularly to an electrostatic chuck mechanism and a peripheral mechanism thereof which can suppress a reduction in throughput due to an increase in focus time to an observation target even when there is a temperature difference between the device and the observation target.

In a device manufacturing line, in order to measure dimensions of a fine pattern and inspect defects on a device, a device to which a scanning electron microscope is applied is used. For example, a CD-SEM (Critical-Dimension Scanning Electron Microscope) is used for dimension measurement (hereinafter referred to as length measurement) of a gate or a contact hole of a semiconductor device, and a defect inspection SEM or the like is used for defect inspection. In addition, the scanning electron microscope is also used for conduction inspection of deep holes for wiring by using a potential contrast.

Figure 1:
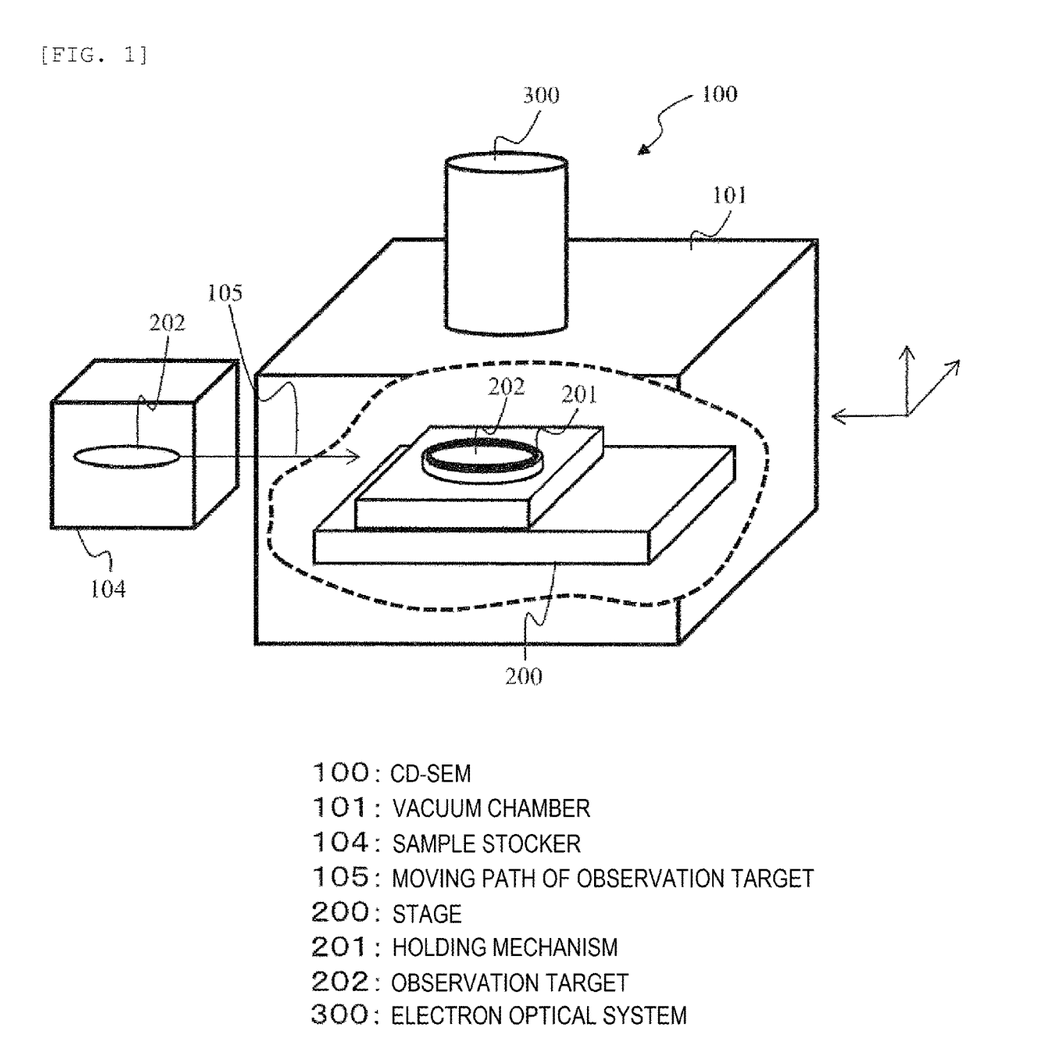
FIG. 1 is a diagram illustrating an outline of a charged particle beam device (CD-SEM).

FIG. 1 is a diagram illustrating an electron microscope which is an embodiment of a charged particle beam device. In the following description, the electron microscope is described as the CD-SEM. A CD-SEM 100 includes a stage 200 which includes a holding mechanism 201 for holding an observation target 202 and has a function of performing driving in the device in multiple axial directions, an electron optical system 300 which discharges electrons to the observation target 202, and a vacuum chamber 101. The dotted line in FIG. 1 is a cutout line which is obtained by cutting out the vacuum chamber 101 in order to visualize the inside. The CD-SEM 100 takes in the observation target 202 from a sample stocker 104 outside the device along a moving path 105 of the observation target, and holds the observation object 202 using an electrostatic chuck 201 included in the stage 200; after positioning the observation target 202 with respect to the electron optical system 300, the electron optical system 300 focuses on a desired portion of the observation target 202 to measure the length.

Figure 2:
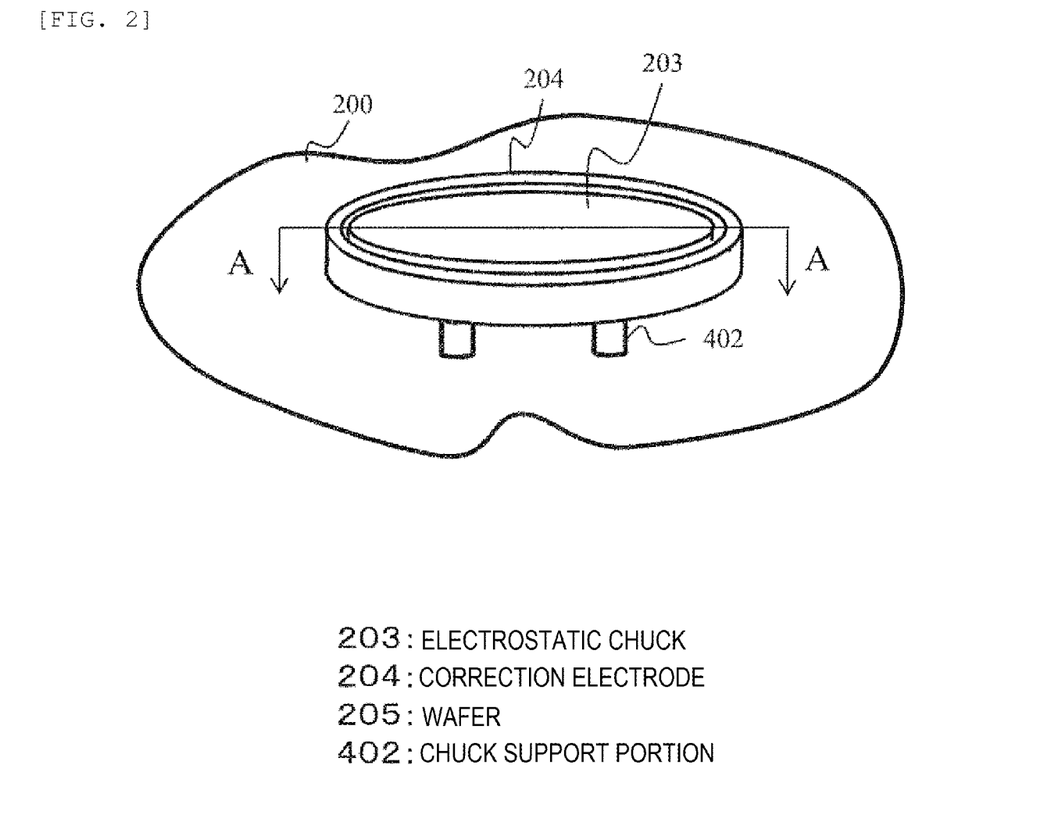
FIG. 2 is a diagram illustrating an outline of a holding mechanism (electrostatic chuck mechanism).

Next, the holding mechanism of the observation target will be described. FIG. 2 illustrates an outline of the holding mechanism. In the CD-SEM, an electrostatic chuck 203 may be used as the holding mechanism of a semiconductor wafer (hereinafter referred to as a wafer) which is an observation target. The electrostatic chuck 203 has a disc shape formed mainly of a ceramic constituting a dielectric layer, a positive or negative charge is generated on surfaces of the wafer and the electrostatic chuck 203 by applying a voltage to a metal electrode provided therein, and the wafer is fixed by a Coulomb force acting therebetween.

The wafer is molded to have a very high flatness, and an attraction surface of the electrostatic chuck 203 is also molded to have a very high flatness (±several μm) so as not to cause deformation of the wafer. The attraction surface of the electrostatic chuck 203 is substantially the same size as the wafer. The electrostatic chuck 203 is fixed to the stage 200 via a chuck support portion 402. In addition, a correction electrode 204 is provided around the electrostatic chuck 203. The correction electrode 204 is fixed to the electrostatic chuck 203. Details of the correction electrode 204 will be described later.

Figure 3:
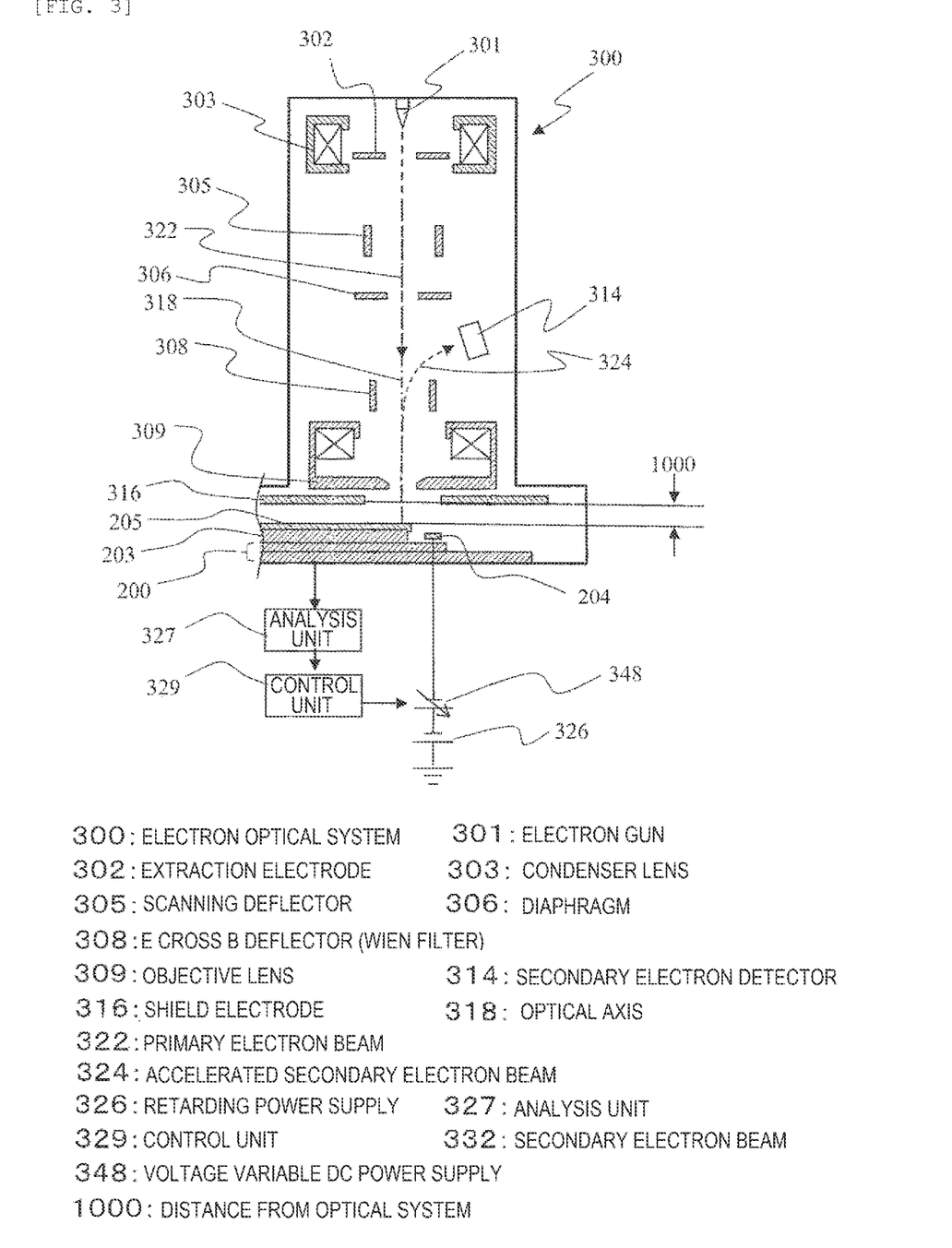
FIG. 3 is a diagram illustrating an outline of an optical system of the charged particle beam device.

FIG. 3 illustrates an outline of the electron optical system 300. A primary electron beam 322 (indicated by a broken line) discharged from an electron gun 301 by the voltage of an extraction electrode 302 passes through a condenser lens 303, a scanning deflector 305, a diaphragm 306, an objective lens 309, or the like, is converged and deflected, and is emitted to an inspection position of a wafer 205 which is an observation target. The condenser lens 303, the scanning deflector 305, the diaphragm 306, the objective lens 309 and a shield electrode 316 are formed in an axisymmetric shape with an optical axis 318 as a central axis.

A deceleration voltage (hereinafter referred to as a retarding voltage) is applied to the wafer 205 from a retarding power supply 326 for deceleration of the primary electron beam 322. A secondary electron beam 324 (indicated by a broken line) is generated from the wafer 205 by irradiation of the primary electron beam 322, and is accelerated by the retarding voltage applied to the wafer 205 to move upward. The accelerated secondary electron beam 324 is deflected by an E cross B deflector 308, and is incident on a secondary electron detector 314. In the secondary electron detector 314, the incident secondary electron 324 is converted into an electrical signal, and the electrical signal is amplified by a preamplifier (not shown) to become a luminance modulation input for a signal of an inspection image, so that an SEM image, which is image data of an inspection region, is obtained.

When the CD-SEM inspects a portion other than an end portion of the wafer 205, for example, a central portion thereof, since an equipotential surface near the wafer 205 is formed flat and in parallel along the surface of the wafer 205, axisymmetric distribution is obtained with the optical axis 318 as a central axis. However, when the end portion of the wafer 205 is being inspected, since the surface of the wafer 205 disappears at the end portion and the equipotential surface cannot be formed along the surface of the wafer 205 from the end portion to the outside, the axial symmetry of the equipotential surface near the wafer 205 may be disturbed. When the axial symmetry of the equipotential surface is disturbed, the primary electron beam 322 is bent and hits the position away from a position originally to be inspected on the wafer 205, where the optical axis 318 intersects the surface of the wafer 205, and as a result, the portion to be observed deviates.

In order to suppress the deviation of the irradiation position, the correction electrode 204 is installed around the wafer 205 of the stage 200, and a voltage variable DC power supply 348 is connected to the correction electrode 204. A analysis unit 327 calculates a set voltage of the DC power supply 348 according to a distance 1000 from the optical system, which is the distance from the optical system 300 to the surface of the wafer 205, and the irradiation condition of the primary electron beam 322, and a control unit 329 (control device) controls the DC power supply 348 to the set voltage.

Figure 4:
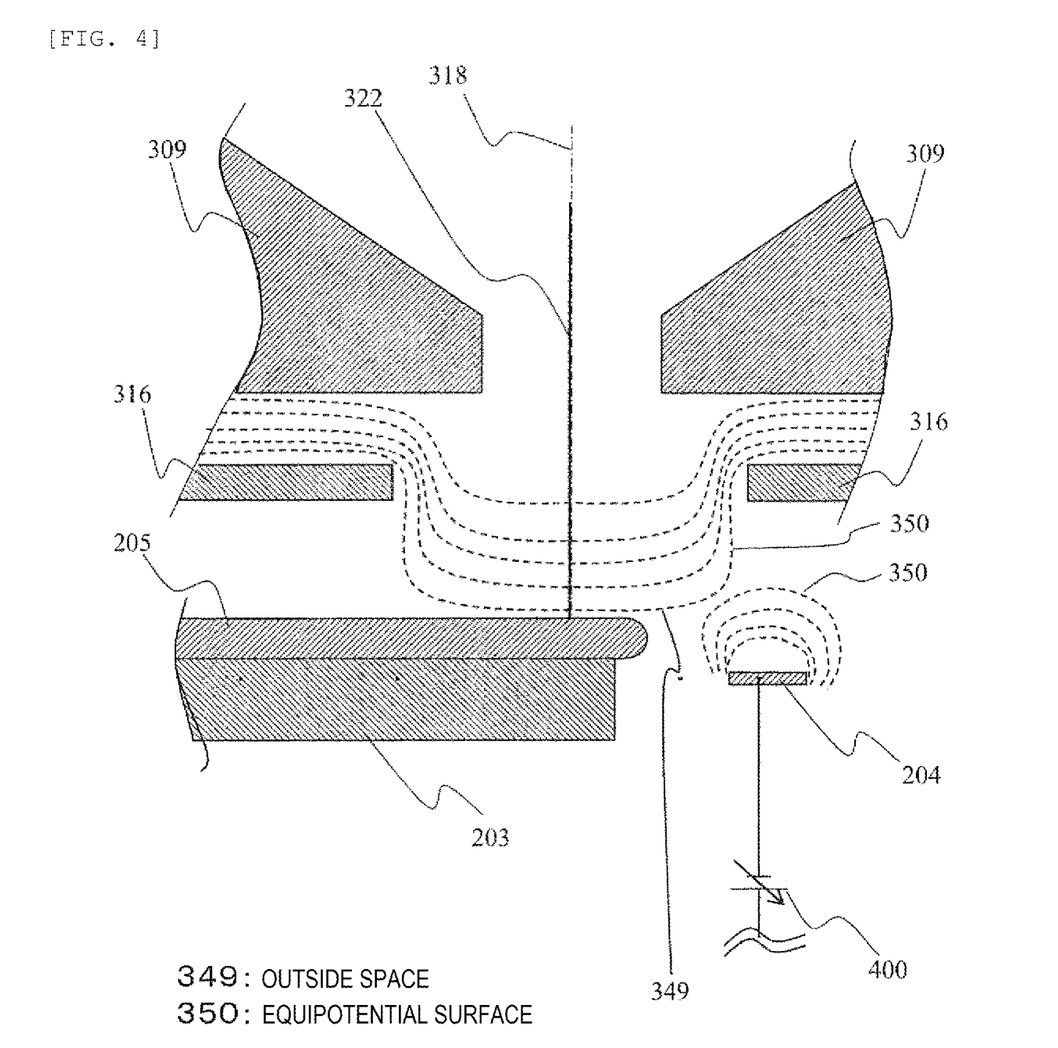
FIG. 4 is a diagram illustrating an example of correcting an electric field at an end portion of a sample by applying a voltage to a correction electrode.

FIG. 4 is a diagram illustrating an example in which an electric field at an edge portion of the sample is corrected based on a voltage applied to the correction electrode 204. By applying a voltage to the correction electrode 204, an electric field can be formed such that the equipotential surface which is flat and parallel to the wafer surface can be formed from the end portion of the wafer 205 to a space 349 outside the wafer, as if the wafer surface extends thereto. Accordingly, by correcting an electric field which is a non-axis object for the optical axis of the electron beam, a portion to be observed can be appropriately irradiated with the beam.

Figure 5:
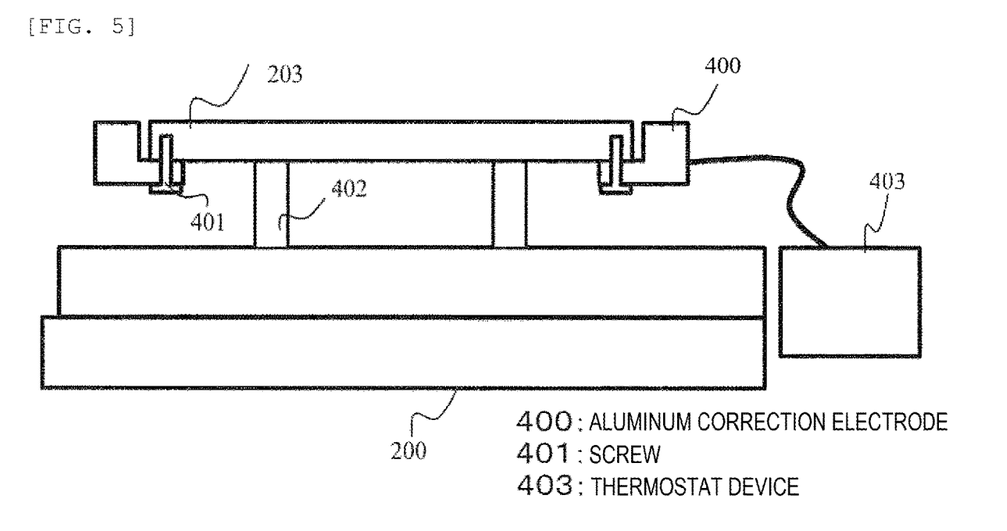
FIG. 5 is a diagram illustrating an electrostatic chuck mechanism in which a correction electrode is attached to a ceramic constituting a dielectric layer.

FIG. 5 is a diagram illustrating an example in which the correction electrode is directly attached to a ceramic electrostatic chuck (A-A cross section in FIG. 2). In FIG. 5, an aluminum correction electrode 400 is directly fixed to the electrostatic chuck 203 with a screw 401, thereby suppressing a change in a relative distance from the design value. Since the equipotential surface is influenced by the distance from the wafer to the aluminum correction electrode 400, it is desirable that the relative distance does not deviate from the design value. However, since the aluminum correction electrode 400 cannot be directly positioned because of not being in contact with the wafer, in the example of FIG. 5, the relative distance from the wafer to the aluminum correction electrode 400 is not deviated from the design value by directly fixing the aluminum correction electrode 400 to the electrostatic chuck 203 fixed in contact with the wafer. The reason why the aluminum correction electrode 400 is used is that the electrons discharged from the electron optical system are not adversely influenced by using the magnetic material. For the same reason, aluminum is also used for the stage.

When there is a temperature difference between the aluminum correction electrode 400 or the electrostatic chuck 203 and the wafer, a thermostat device 403 may be provided so as not to change the temperature. However, the study of the inventors has been found that even when the thermostat device 403 is provided, it is difficult to completely suppress the temperature change, and due to heat conduction accompanying the contact with the wafer, the aluminum correction electrode 400 and the electrostatic chuck 203 change in temperature and deform into a warped shape such as a mortar shape or a dome shape.

Figure 6:
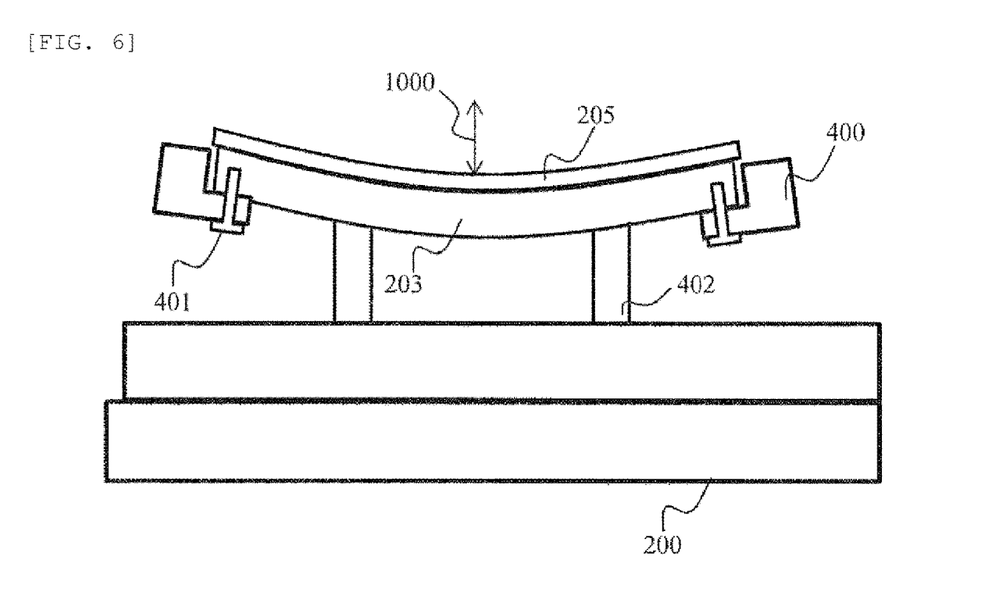
FIG. 6 is a diagram illustrating a principle of sample deformation which occurs when a high-temperature sample is mounted on the electrostatic chuck.

FIG. 6 illustrates a cross-sectional view of the aluminum correction electrode 400 and the electrostatic chuck 203 when the wafer 205 having a high relative temperature is taken in. The deformation mechanism is that the ceramic electrostatic chuck 203 and the aluminum correction electrode 400 having a difference in linear expansion coefficient change in temperature and bimetallicly deform due to the difference in elongation. The linear expansion coefficient of ceramic is about $7 \times 10^{-6}$ [/K] and the linear expansion coefficient of aluminum is about $2 \times 10^{-5}$ [/K]. Since the wafer 205 attracted and fixed to the electrostatic chuck 203 is thinner and easier to deform as compared to the electrostatic chuck 203 and the aluminum correction electrode 400, the wafer 205 deforms into a shape similar to that of the electrostatic chuck 203. In general, the heat transfer includes conduction, convection, and radiation, but since there is no convection because around the wafer is a vacuum and radiation also has almost no influence on radiation at about 20° C. which is a general use environment of the CD-SEM, the heat transfer mainly occurs among the wafer 205, the aluminum correction electrode 400 and the electrostatic chuck 203. A plurality of rectangular chips (not shown) are formed over substantially the entire area of the wafer 205. When there are a plurality of length measurement points, the CD-SEM moves the stage 200 to position the wafer 205 to a new length measurement point with respect to the electron optical system, then performs focus of the electron optical system, and repeats the length measurement. Therefore, as shown in FIG. 6, when the distance 1000 from the optical system of the current length measurement point to the optical system of the new measurement point increases or decreases, the time for performing focus increases, and as a result, the throughput of the CD-SEM decreases.

Therefore, the present embodiment describes a charged particle beam device including an electrostatic chuck mechanism capable of suppressing sample deformation due to a temperature difference between the wafer and the chuck mechanism. If the sample deformation can be suppressed, the reduction in throughput can be suppressed.

In the present embodiment, a stage, which can be driven in multiple axial directions (at least two directions) and includes an electrostatic chuck for holding a wafer and an aluminum correction electrode, is provided with a fixing member (support member) for independently fixing the ceramic electrostatic chuck and the aluminum correction electrode not in contact with each other. When the electrostatic chuck and the aluminum correction electrode are not directly fixed, the relative position thereof may deviate, but a change in the equipotential surface near the end portion of the wafer due to this deviation is preferably suppressed by the control of the voltage variable DC power supply applied to the aluminum correction electrode.

According to the above configuration, the inspectability of the outer periphery of the wafer is good and the reduction in throughput can be suppressed even when and the length measurement of the wafer having a temperature difference is performed.

First Embodiment

Figure 7:
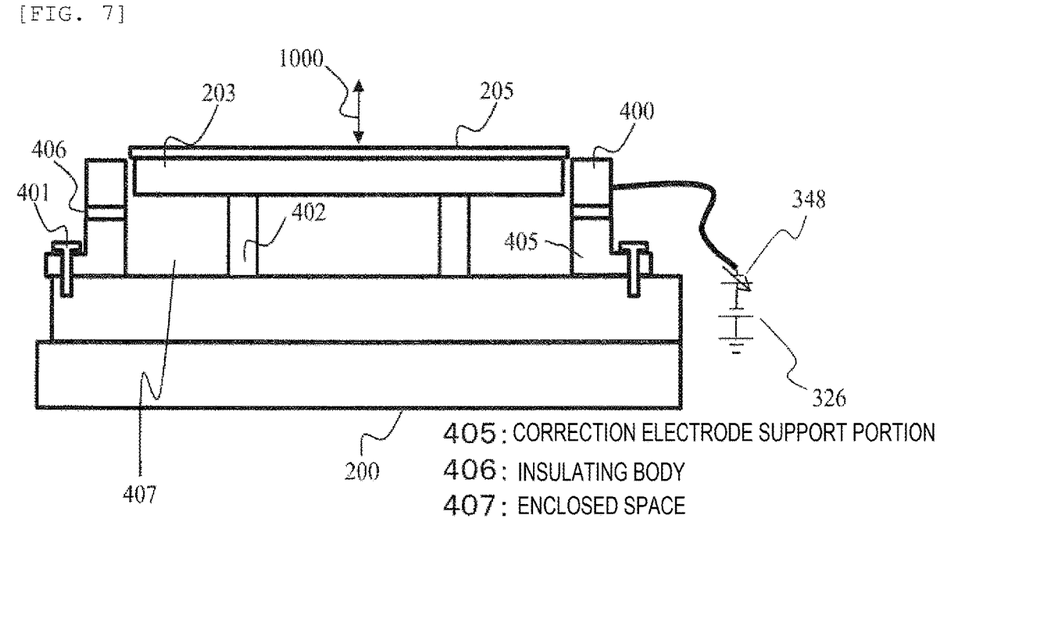
FIG. 7 is a diagram illustrating an example of the electrostatic chuck mechanism including a correction electrode support member (second support member) different from a support member (first support member) of the electrostatic chuck.

FIG. 7 is a diagram illustrating an example of the electrostatic chuck mechanism, in which the ceramic electrostatic chuck and the aluminum correction electrode (ring-shaped electrode) are respectively supported by different support members, and whereby ceramic and aluminum are not in contact with each other. In the example of FIG. 7, the ceramic electrostatic chuck 203 is fixed to the stage 200 via the chuck support portion 402, and the aluminum correction electrode 400 is fixed to the stage 200 via a correction electrode support portion 405 and an insulating body 406. The insulating body 406 prevents the voltage of the voltage variable DC power supply 348 from conducting to the aluminum stage 200. In this configuration, since an assembly error from the stage 200 is respectively generated in the electrostatic chuck 203 and the aluminum correction electrode 400, the relative distance from the electrostatic chuck 203 to the aluminum correction electrode 400 is easier to deviate from the design value as compared to the case of directly fixing, and as a result, the correction of the potential of the aluminum correction electrode 400 may not be appropriate for the wafer 205 fixed to the electrostatic chuck 203. However, in the present embodiment, there is no problem since the voltage adjustment of the voltage variable DC power supply 348 compensates for the change in the potential caused by the change in the relative distance. In this case, at a plurality of points at different positions on the end portion of the wafer, it is preferable that a correction amount corresponding to the deviation is registered in a predetermined storage medium as a table in advance, the applied voltage is read and the voltage is applied according to the address information stored in a recipe which is an operation program at the time of measurement.

Figure 8:
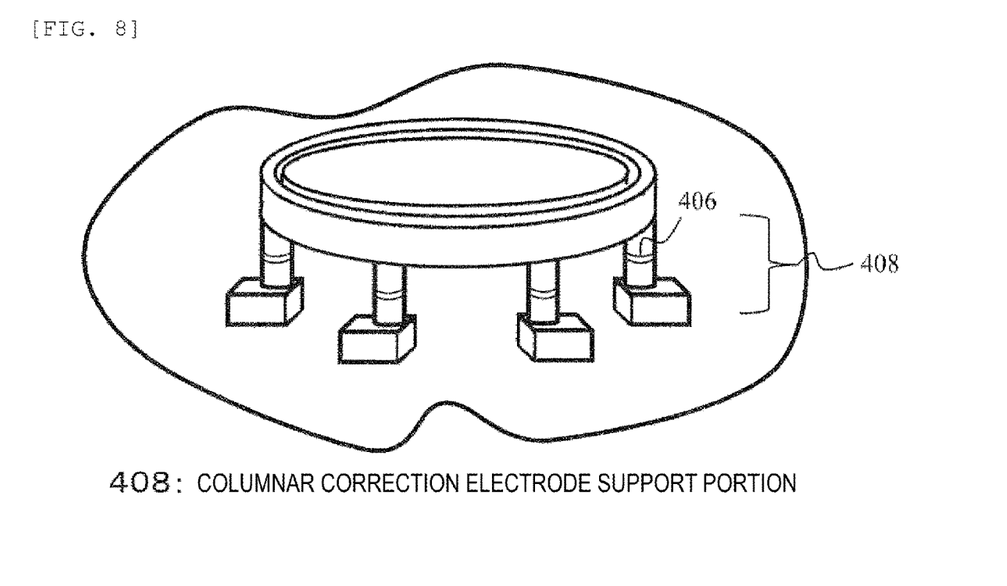
FIG. 8 is a diagram illustrating an example of the electrostatic chuck mechanism supporting a correction electrode by a plurality of correction electrode support members.

When the aluminum correction electrode 400 in FIG. 6 has a ring shape (in other words, a cross-sectional shape similar to FIG. 6 over the entire periphery of the electrostatic chuck 203), a space 407 enclosed by the electrostatic chuck 203, the stage 200 and the aluminum correction electrode 400 is generally sealed. In this case, when exhausting the vacuum chamber, it is considered that the air is accumulated in the enclosed space 407 and the vacuum exhaustion is interrupted, but the circulation of the air between a lower space of the electrostatic chuck and an inner space of the vacuum chamber other than the lower space can be ensured, and rapid vacuum exhaustion can be performed by making correction electrode support portions as columnar correction electrode support portions, as shown in FIG. 8.

As described above, even when the temperature of the wafer is different from the temperature of the electrostatic chuck, the sample deformation can be suppressed, and as a result, the reduction in the throughput of the measurement device can be suppressed.

Second Embodiment

Figure 9:
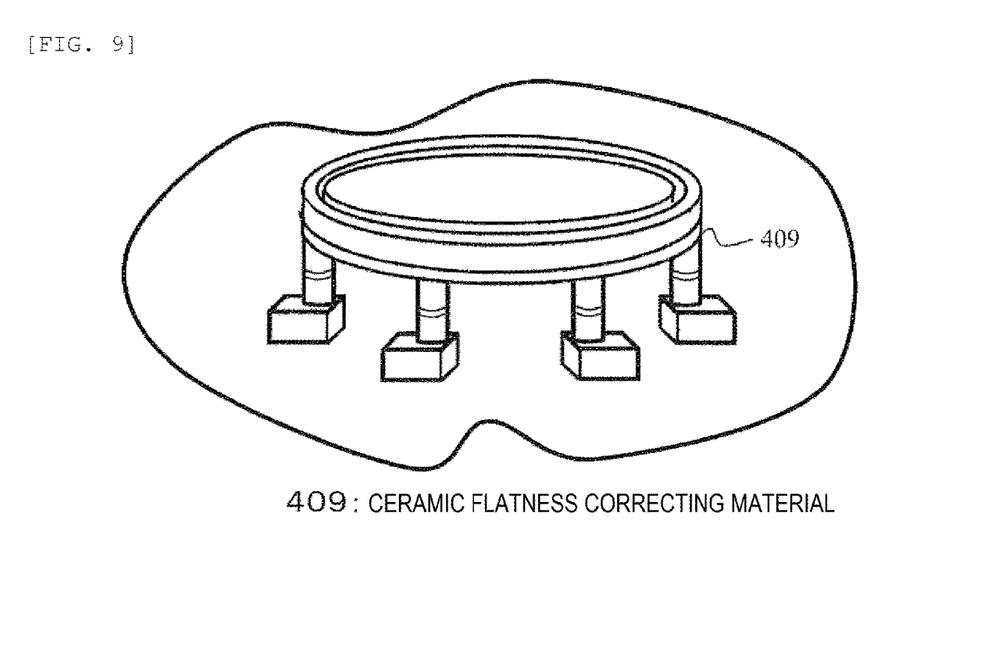
FIG. 9 is a diagram illustrating an example of an electrostatic chuck mechanism including a flatness correcting material for keeping the correction electrode flat.

Next, a second embodiment will be described. The first embodiment describes a configuration in which the aluminum correction electrode 400 is supported by a plurality of support members, but the second embodiment describes an example in which the aluminum correction electrode 400 is supported by a ring-shaped plate-like body made of ceramic and the plate-like body is supported by a plurality of support members. As shown in FIG. 9, it is different from the first embodiment in that the aluminum correction electrode 400 is supported by a ceramic flatness correcting material 409 for keeping the same flat. Effects of the second embodiment will be described below. Even when the aluminum-based material is molded by cutting or the like, a desired high flatness (±several tens μm) may not be obtained due to the influence of stress remaining on the material itself. When the aluminum correction electrode 400 having a poor flatness and waved is used, near the end portion of the wafer, the equipotential surface to be formed flat along the surface of the wafer is wavy, and an increase or decrease in the voltage of the voltage variable DC power supply 348 cannot be coped with. However, the aluminum correction electrode 400, which is fixed to the ceramic flatness correcting material 409 molded from a ceramic easy to be processed at a high flatness, can suppress formation of a wavy shape. As described above, the equipotential surface can be planarized with high accuracy by interposing the ring-shaped plate-like body made of ceramic, which can form a flat surface with high accuracy, between the correction electrode and the support member.

Third Embodiment

Figure 10:
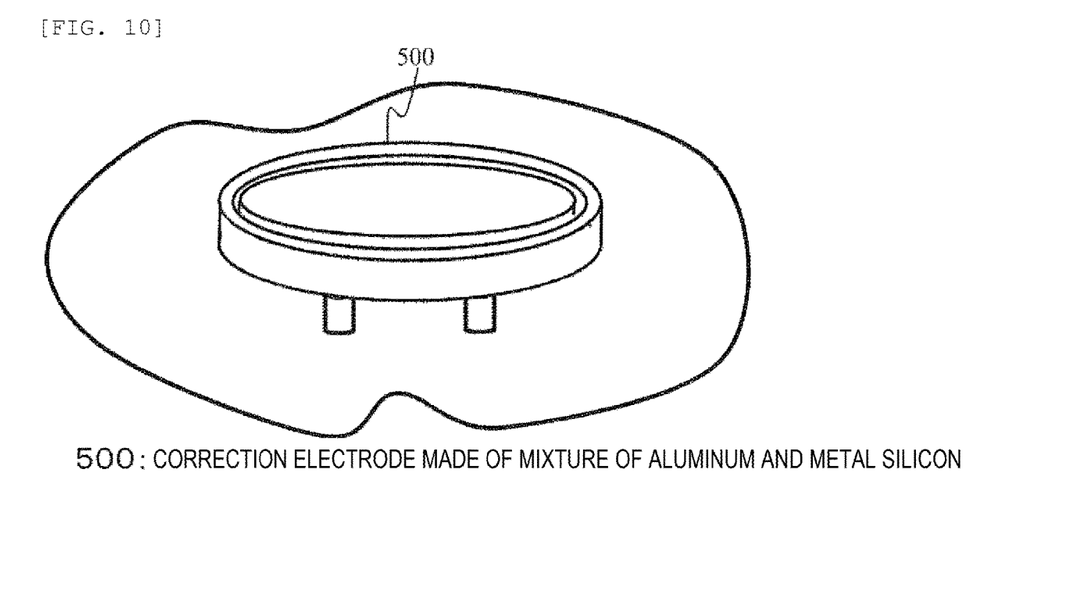
FIG. 10 is a diagram illustrating an example of an electrostatic chuck mechanism including a correction electrode made of a mixture of aluminum and metal silicon.

Next, a third embodiment will be described. FIG. 10 illustrates an outline of the third embodiment. In the third embodiment, the correction electrode is molded with a mixed material of aluminum and metal silicon, whose linear expansion coefficient is close to that of the electrostatic chuck (of linear expansion coefficient is $8 \times 10^{-6}$ [/K]). Since the difference in linear expansion coefficient between the ceramic and the correction electrode 500 made of a mixed material of aluminum and metal silicon is small, the sample deformation caused by the difference between the wafer temperature and the chuck temperature can be suppressed. Further, since the mixed material of aluminum and metal silicon is a nonmagnetic conductor, it does not influence the electron beam.

Fourth Embodiment

Figure 11:
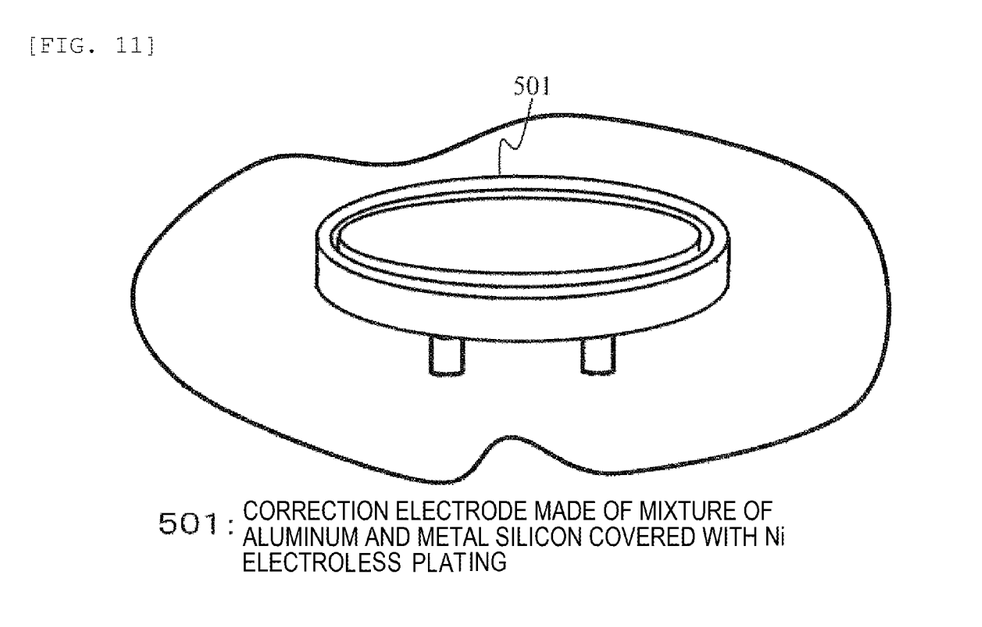
FIG. 11 is a diagram illustrating an example of an electrostatic chuck mechanism including a correction electrode made of a mixture of Ni-plated aluminum and metal silicon.

Next, a fourth embodiment will be described. FIG. 11 illustrates an outline of a fourth embodiment, showing a cross-sectional view of the correction electrode and the electrostatic chuck. In the third embodiment, the correction electrode 500 made of the mixed material of aluminum and metal silicon is used, but in the fourth embodiment, the surface of the correction electrode 500 made of the mixed material of aluminum and metal silicon is covered with Ni electroless plating. By using a Ni-plated correction electrode 501 made of a mixture of aluminum and metal silicon, the following effects can be obtained. The effects of the fourth embodiment will be described below. The mixed material of aluminum and metal silicon is a porous material with a very large number of pores. Thus, the gas may be released, and the degree of vacuum may be reduced. In the fourth embodiment, the release of the gas can be suppressed by covering the surface with the Ni electroless plating. In addition, since the Ni electroless plating is non-magnetic, it does not influence the electron beam.

Further, it is also effective to use an alumina ceramic material for the correction electrode and to cover the surface with the Ni electroless plating. In this case, since the ceramic does not have conductivity, the Ni electroless plating is responsible for the conductivity of the correction electrode. In addition, since the Ni-plated ceramic electrode is non-magnetic, it does not influence the electron beam.

REFERENCE SIGN LIST

100 CD-SEM
101 Vacuum chamber
104 Sample stocker
105 Moving path of observation target
200 Stage
201 Holding mechanism
202 Observation target
203 Electrostatic chuck
204 Correction electrode
205 Wafer
300 Electron optical system
301 Electron gun
302 Extraction electrode
303 Condenser lens
305 Scanning deflector
306 Diaphragm
308 E cross B deflector
309 Objective lens
314 Secondary electron detector
316 Shield electrode
318 Optical axis
322 Primary electron beam
324 Accelerated secondary electron beam
326 Retarding power supply
327 Analysis unit
329 Control unit
332 Secondary electron beam
348 Voltage variable DC power supply
349 Outside space
350 Equipotential surface
400 Aluminum correction electrode
401 Screw
402 Chuck support portion
403 Thermostat device
405 Correction electrode support portion
406 Insulating body
407 Enclosed space
408 Columnar correction electrode support portion
409 Ceramic flatness correcting material
500 Correction electrode made of aluminum and metal silicon
501 Correction electrode made of mixture of aluminum and metal silicon covered with Ni electroless plating
1000 Distance from optical system

The invention claimed is:
1. A charged particle beam device including an electrostatic chuck mechanism, the charged particle beam device comprising:

a stage which moves a sample, which is to be irradiated with a charged particle beam, relative to an irradiation position of the charged particle beam;

an insulating body which is disposed on the stage and constitutes a dielectric layer of the electrostatic chuck;

a first support member which supports the insulating body on the stage;

a ring-shaped electrode which encloses the surroundings of the sample and is not in contact with the insulating body, and to which a predetermined voltage is applied; and a second support member which supports the ring-shaped electrode at a position different from the first support member on the stage.

2. The charged particle beam device according to claim 1, further comprising a control device which controls a power supply applying a voltage to the ring-shaped electrode, wherein the control device applies a voltage corresponding to the irradiation position of the charged particle beam based on information stored in a storage medium.

3. The charged particle beam device according to claim 1, wherein the first support member and the second support member are columnar members disposed on the stage.

4. The charged particle beam device according to claim 1, wherein a ring-shaped plate-like body having a flat surface is disposed between the ring-shaped electrode and the second support member.

5. The charged particle beam device according to claim 4, wherein the ring-shaped plate-like body is formed of a material containing a ceramic.

6. A charged particle beam device including an electrostatic chuck mechanism, the charged particle beam device comprising:

a stage which moves a sample, which is to be irradiated with a charged particle beam, relative to an irradiation position of the charged particle beam;

a ceramic which is supported by a first support member at a first position on the stage and constitutes a dielectric layer of the electrostatic chuck; and a ring-shaped electrode which is supported by a second support member at a second position different from the first position on the stage and encloses the surroundings of the sample, and to which a predetermined voltage is applied, wherein the ring-shaped electrode is made of a mixture of aluminum and metal silicon.

7. The charged particle beam device according to claim 6, wherein the ring-shaped electrode is subjected to metal plating.

8. The charged particle beam device according to claim 7, wherein a metal used for the metal plating is nickel.

9. A charged particle beam device including an electrostatic chuck mechanism, the charged particle beam device comprising:

a stage which moves a sample, which is to be irradiated with a charged particle beam, relative to an irradiation position of the charged particle beam;

a ceramic which is supported by a first support member at a first position on the stage and constitutes a dielectric layer of the electrostatic chuck; and a ring-shaped electrode which is supported by a second support member at a second position different from the first position on the stage and encloses the surroundings of the sample, and to which a predetermined voltage is applied, wherein the ring-shaped electrode is subjected to metal plating.

10. The charged particle beam device according to claim 9, wherein a metal used for the metal plating is nickel.

* * * * *